(12) United States Patent
Koscielnik et al.

(10) Patent No.: US 8,922,417 B2
(45) Date of Patent: Dec. 30, 2014

(54) METHOD AND APPARATUS FOR CONVERSION OF PORTION OF ELECTRIC CHARGE TO DIGITAL WORD

(75) Inventors: Dariusz Koscielnik, Cracow (PL); Marek Miskowicz, Cracow (PL)

(73) Assignee: Akademia Gorniczo-Hutnicza IM. Stanislawa Staszica, AL., Cracow (PL)

( * ) Notice: Subject to any disclaimer, the term of this patent is extended or adjusted under 35 U.S.C. 154(b) by 34 days.

(21) Appl. No.: 13/702,181

(22) PCT Filed: Jun. 5, 2011

(86) PCT No.: PCT/PL2011/050020
§ 371 (c)(1),
(2), (4) Date: Feb. 19, 2013

(87) PCT Pub. No.: WO2011/152743
PCT Pub. Date: Dec. 8, 2011

(65) Prior Publication Data
US 2013/0169464 A1     Jul. 4, 2013

(30) Foreign Application Priority Data
Jun. 5, 2010  (PL) .......................................... 391419

(51) Int. Cl.
*H03M 1/12*     (2006.01)
*H03M 1/46*     (2006.01)
(52) U.S. Cl.
CPC ................ *H03M 1/12* (2013.01); *H03M 1/466* (2013.01)
USPC .......................................... 341/172; 341/155

(58) Field of Classification Search
CPC .............................. H03M 1/466; H03M 1/468
USPC .................................. 341/155, 161, 163, 172
See application file for complete search history.

(56) References Cited

U.S. PATENT DOCUMENTS

| | | | | |
|---|---|---|---|---|
| 4,195,282 A | * | 3/1980 | Cameron | 341/172 |
| 4,200,863 A | * | 4/1980 | Hodges et al. | 341/156 |
| 6,268,813 B1 | * | 7/2001 | de Wit | 341/120 |
| 7,095,345 B2 | * | 8/2006 | Nguyen et al. | 341/120 |
| 7,876,254 B2 | * | 1/2011 | Berens et al. | 341/163 |

* cited by examiner

*Primary Examiner* — Brian Young
(74) *Attorney, Agent, or Firm* — Ladas & Parry LLP

(57) ABSTRACT

The solution according to the invention consisting in conversion of a portion of electric charge to a digital word of a number of bits equal to n by the use of successive redistribution of charge in the array (A) of binary-scaled capacitors $(C_{n-1}, \ldots, C_o)$ is characterized in that charge is first accumulated during the active state of the external gate signal on the gate signal input (InG) in the capacitors $(C_{n-1}, \ldots, C_o)$ in the order of decreasing capacitances starting from the capacitor $(C_{n-1})$ having the highest capacitance value in the array, and when the active state of the gate signal is terminated, the charge accumulated in the capacitor $(C_x)$ charged recently is successively transferred by the use of the current source (I) to the capacitors of lower capacitance values. The process of charge transfer is controlled by the control module (CM) on the basis of the output signals of the comparators (K1) and (K2) without the use of a clock while the value one is assigned to these bits $(b_{n-1}, \ldots, b_o)$ in the digital output word that correspond to the capacitors $(C_{n-1}, \ldots, C_o)$ on which the reference voltage $(U_L)$ of a desired value has been obtained, and the value zero is assigned to the other bits.

7 Claims, 9 Drawing Sheets

Figure 1:
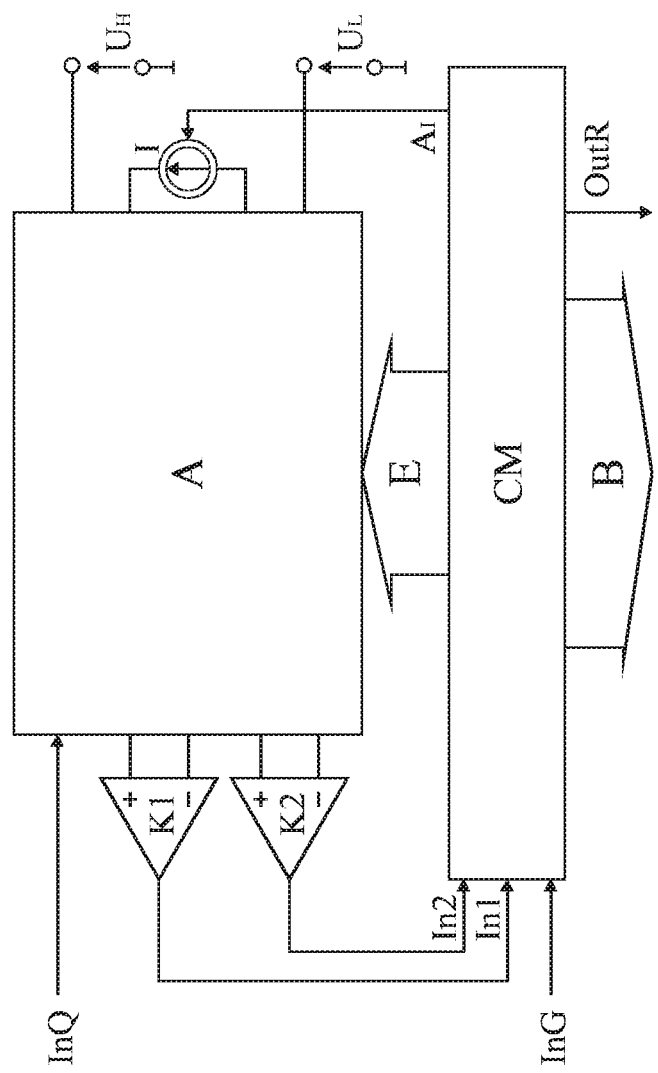

METHOD AND APPARATUS FOR CONVERSION OF PORTION OF ELECTRIC CHARGE TO DIGITAL WORD

The subject of this invention is a method and an apparatus for conversion of an electric charge value to a digital word that can be applied in monitoring and control systems.

The method for the conversion of the analog signal to the digital signal known from the article (James McCreary, Paul R. Gray "A High-Speed, All-MOS Successive-Approximation Weighted Capacitor A/D Conversion Technique", Proceedings of IEEE International Solid-State Circuits Conference, February 1975, pp. 38-39) exploits the electric charge redistribution in the array of capacitors according to the successive approximation algorithm. The first stage of this method is sampling an instantaneous value of the input voltage signal consisting in accumulation of electric charge whose value is directly proportional to the input voltage value in the array of capacitors connected in parallel. The capacitance value of each given capacitor is twice as high as the capacitance value of the previous capacitor in the array, and one of plates of each capacitor is connected to the first common rail. As soon as sampling is terminated, the process of conversion of the accumulated charge value to a digital word is realized through its appropriate redistribution among the capacitors in the array. The conversion process is started from moving the other plate of the capacitor having the highest capacitance value to the reference potential of a desired value. A state of the switches exploited for this purpose is controlled by a synchronous sequential control module that generates relevant control signals. The charge redistribution among the capacitors in the array, which is enforced in this way, causes a change of a resultant potential of the first common rail. This potential is compared to the potential of the ground of the circuit by the use of a comparator. If the resultant potential of the first rail after changing the potential of the other plate of a given capacitor is higher than the potential of the ground of the circuit, this plate is moved back to the potential of the ground of the circuit, and the relevant bit in a digital word corresponding to this capacitor is set to zero. Otherwise, the other plate of this capacitor is left on the reference potential, and the relevant bit in a digital word is set to one. Afterwards, the potential of the other plate of the next capacitor of twice lower capacitance value is changed by means of the control module, and after that, the cycle is repeated until the whole digital word having a number of bits equal to n is generated where a duration of the sampling stage and a duration of successive steps of the conversion process is determined by period of the clock signal that clocks the circuit operation.

The voltage analog-to-digital converter known from the article (James McCreary, Paul R. Gray "A High-Speed, All-MOS Successive-Approximation Weighted Capacitor A/D Conversion Technique", Proceedings of IEEE International Solid-State Circuits Conference, February 1975, pp. 38-39) comprises the successive approximation capacitor array whose one input is connected to the source of converted input voltage, whereas the other input is connected to the source of the reference voltage while its output is connected to the sequential control module through the comparator. The sequential control module is equipped with the digital output and the input of the clock signal that clocks a course of the conversion process. Two control outputs of the sequential control module are connected to the comparator, and the other control outputs are connected to the successive approximation capacitor array. The successive approximation capacitor array comprises a number of n capacitors of binary-weighted capacitance values and an additional capacitor while the first plate of each capacitor in the array is connected to the first common rail, and the capacitance value of the additional capacitor equals the capacitance value of the smallest capacitor in the array. The other plates of the capacitors in the array are connected to the other common rail through the changeover switches whose other stationary contacts are connected to the ground of the circuit. The first common rail is connected to the non-inverting input of the comparator, and the second common rail is connected through another switch to the source of the input voltage or to the source of the reference voltage while the inverting input of the comparator is connected to the ground of the circuit.

The method according to the invention consisting in accumulation of electric charge in at least one capacitor and conversion of a portion of electric charge to a digital word having a number of bits equal to n is characterized in that electric charge is accumulated in an array of capacitors while a capacitance value of a capacitor of a given index is twice as high as a capacitance value of the capacitor of the previous index and charge accumulation is started from the capacitor having the highest capacitance value in the array of capacitors and is realized during the active state of the gate signal detected by means of the control module or until the voltage, which increases on this capacitor and is simultaneously observed by the use of the second comparator, equals the reference voltage value, and in this case the charge accumulation is continued in the subsequent capacitor in the array of capacitors whose capacitance value is twice lower than the capacitance value of the capacitor in which charge was accumulated directly before, and at the same time the voltage increasing on the capacitor in which charge is accumulated currently is compared to the reference voltage value by the use of the second comparator, and the cycle is repeated until the active state of the gate signal detected by means of the control module is terminated. Afterwards, the function of the source capacitor whose index is defined by the content of the source capacitor index register in the control module is assigned by means of the control module to the capacitor in the array of capacitors, which is the last capacitor in which charge was accumulated, by writing the value of the index of this capacitor to the source capacitor index register. At the same time, by writing the value stored in the source capacitor index register reduced by one to the destination capacitor index register, the function of the destination capacitor whose index is defined by the content of the destination capacitor index register in the control module is assigned by means of the control module to the subsequent capacitor in the array whose capacitance value is twice lower than the capacitance value of the source capacitor. Then, the electric charge accumulated in the source capacitor is transferred to the destination capacitor by the use of the current source. At the same, time the voltage increasing on the destination capacitor is compared to the reference voltage value by the use the second comparator, and also the voltage on the source capacitor is observed by the use of the first comparator, and when the voltage on the source capacitor observed by the use of the first comparator equals zero during the charge transfer, the function of the source capacitor is assigned to the current destination capacitor by means of the control module on the basis of the output signal of the first comparator by writing the current content of the destination capacitor index register in the control module to the source capacitor index register in the control module, and also the function of the destination capacitor is assigned to the subsequent capacitor in the array whose capacitance value is twice lower than the capacitance value of the capacitor that operated as the destination capacitor directly before by reducing the content of the destination capacitor index register by one, and charge transfer from a new source capacitor to a new destination capacitor is continued by the use of the current source, and when the voltage on the destination capacitor observed by the use of the second comparator equals the reference voltage value during the transfer of charge from the source capacitor to the destination capacitor, the function of the destination capacitor is assigned by means of the control module on the basis of the output signal of the second comparator to the subsequent capacitor in the array whose capacitance value is twice lower than the capacitance value of the capacitor that operated as the destination capacitor directly before by reducing the content of the destination capacitor index register by one. Next, the charge transfer from a source capacitor to a new destination capacitor is continued while this process is still controlled by means of the control module on the basis of the output signals of both comparators until the voltage on the source capacitor observed by the use of the first comparator equals zero during the period in which the function of the destination capacitor is assigned to the capacitor having the lowest capacitance value in the array of capacitors, or the voltage increasing on the capacitor of the lowest capacitance value in the array and observed at the same time by the use of the second comparator equals the reference voltage value while the value one is assigned to these bits in the digital word corresponding to the capacitors in the array of capacitors on which the voltage equal to the reference voltage value has been obtained, and the value zero is assigned to the other bits by means of the control module.

In the another variant, the method is characterized in that electric charge is accumulated in the sampling capacitor during the active state of the gate signal detected by means of the control module, and after detecting the end of the active state of the gate signal by means of the control module, the function of the source capacitor whose index is defined by the content of the source capacitor index register in the control module is assigned by means of the control module to the sampling capacitor by writing the value of the index of the sampling capacitor to the source capacitor index register, and also the function of the destination capacitor whose index is defined by the content of the destination capacitor index register in the control module is assigned by means of the control module to the capacitor having the highest capacitance value in the array of capacitors by writing the value of the index of the capacitor of the highest capacitance value in the array to the destination capacitor index register. Next, the process of electric charge transfer from the source capacitor to the destination capacitor is realized by the use of the current source on the basis of the output signals of both comparators until the voltage on the source capacitor observed by the use of the first comparator equals zero during the period in which the function of the destination capacitor is assigned to the capacitor having the lowest capacitance value in the array of capacitors, or the voltage, which increases on the capacitor of the lowest capacitance value in the array and is simultaneously observed by the use of the second comparator, equals the reference voltage value.

In the another variant, the method is characterized in that electric charge is accumulated during the active state of the gate signal detected by means of the control module in the capacitor having the highest capacitance value in the array of capacitors and at the same time in the sampling capacitor connected in parallel to the capacitor of the highest capacitance value in the array where the capacitance value of the sampling capacitor is not smaller than the capacitance value of the capacitor having the highest capacitance value in the array. After detecting the end of the active state of the gate signal by means of the control module, the function of the source capacitor whose index is defined by the content of the source capacitor index register in the control module is assigned by means of the control module to the sampling capacitor by writing the value of the index of the sampling capacitor to the source capacitor index register, and also the function of the destination capacitor whose index is defined by the content of the destination capacitor index register in the control module is assigned by means of the control module to the capacitor having the highest capacitance value in the array of capacitors by writing the value of the index of the capacitor having the highest capacitance value in the array to the destination capacitor index register. Next, the process of the electric charge transfer from the source capacitor to the destination capacitor is realized by the use of the current source on the basis of the output signals of both comparators until the voltage on the source capacitor observed by the use of the first comparator equals zero during the period in which the function of the destination capacitor is assigned to the capacitor having the lowest capacitance value in the array of capacitors, or the voltage, which increases on the capacitor of the lowest capacitance value in the array and is simultaneously observed by the use of the second comparator, equals the reference voltage value.

The apparatus according to the invention comprising the array of capacitors and at least one comparator connected to the control module equipped with the digital output where the control outputs of the control module are connected to the array of capacitors is characterized in that the charge input is connected to the array of capacitors whose control inputs are connected to the set of control outputs of the control module, and also the control module is equipped with the digital output, the complete conversion signal output, the gate signal input and two control inputs where the first control input is connected to the output of the first comparator whose inputs are connected to one pair of outputs of the array of capacitors, and the other control input of the control module is connected to the output of the second comparator whose inputs are connected to the other pair of outputs of the array. Furthermore, the source of auxiliary voltage together with the source of the reference voltage and the controlled current source are connected to the array of capacitors, and the control input of the controlled current source is connected to the relevant control output of the control module.

The array of capacitors comprises a number of n capacitors, and a capacitance value of a capacitor of a given index is twice as high as a capacitance value of the capacitor of the previous index. The top plate of the capacitor having the highest capacitance value in the array of capacitors is connected through the closed first on-off switch to the first rail with which the top plates of the other capacitors in the array of capacitors are connected through the open first on-off switches while the top plate of the capacitor of the highest capacitance value in the array of capacitors is also connected through the closed second on-off switch to the second rail with which the top plates of the other capacitors in the array are connected through the open second on-off switches. The bottom plate of the capacitor of the highest capacitance value in the array of capacitors is connected to the ground of the circuit through the change-over switch whose moving contact is connected to its first stationary contact and the other stationary contact of this change-over switch is connected to the source of auxiliary voltage and also to the non-inverting input of the first comparator, and the bottom plates of the other capacitors in the array are connected to the source of auxiliary voltage through the relevant change-over switches whose moving contacts are connected to their other stationary contacts, and the first stationary contacts of these change-over switches are connected to the ground of the circuit. On the other hand, the first rail is connected to the ground of the circuit through the open first rail on-off switch and to the non-inverting input of the second comparator whose inverting input is connected to the source of the reference voltage while the second rail is connected to the inverting input of the first comparator. The control inputs of the first on-off switches and the control inputs of the change-over switches in the array are coupled together and connected to the relevant control outputs of the control module while the control inputs of the second on-off switches and the control input of the other on-off switch are connected to the relevant control outputs of the control module. The charge input is connected to the first rail through the closed input on-off switch whose control input is connected to the relevant control output of the control module. On the other hand, one end of the current source is connected to the second rail, and its other end of the current source is connected to the first rail while the control input of the current source is connected to the relevant control output of the control module.

In the another variant of the apparatus, the sampling capacitor is connected to the array of capacitors while the top plate of the sampling capacitor is connected to the first rail through the closed first on-off switch and also it is connected to the second rail through the open second on-off switch, whereas the bottom plate of the sampling capacitor is connected to the ground of the circuit through the change-over switch whose moving contact is connected to its first stationary contact, and the other stationary contact of this change-over switch is connected to the source of auxiliary voltage. The control input of the first on-off switch and the control input of the change-over switch are coupled together and connected to the relevant control output of the control module while the control input of the second on-off switch is connected to the relevant control output of the control module. Also, the top plate of the capacitor having the highest capacitance value in the array of capacitors is connected to the first rail through the open first on-off switch and to the second rail through the closed second on-off switch. On the other hand, the bottom plate of the capacitor having the highest capacitance value in the array of capacitors is connected to the source of auxiliary voltage through the change-over switch whose moving contact is connected to its other stationary contact while the first stationary contact of the change-over switch is connected to the ground of the circuit.

In the another variant of the apparatus, the sampling capacitor is connected to the array of capacitors where the capacitance value of the sampling capacitor is not smaller than the capacitance value of the capacitor having the highest capacitance value in the array of capacitors while the sampling capacitor is connected in parallel to the capacitor of the highest capacitance value in the array of capacitors through the first rail and through the ground of the circuit in a way that the top plate of the sampling capacitor is connected to the first rail through the closed first on-off switch, and the bottom plate of the sampling capacitor is connected to the ground of the circuit through the change-over switch whose moving contact is connected to its first stationary contact while the other stationary contact of the change-over switch is connected to the source of auxiliary voltage. Moreover, the top plate of the sampling capacitor is connected also to the second rail through the open second on-off switch, whereas the control input of the first on-off switch and the control input of the change-over switch are coupled together and connected to the relevant control output of the control module, and the control input of the second on-off switch is connected to the relevant control output of the control module.

The method and the apparatus for conversion of an electric charge value to a digital word according to the invention is characterized by simplicity of design. Furthermore, the use of the external gate signal and the comparators output signals for indication of instants of appropriate switching in the apparatus enables an external source of clock signal consuming considerable amount of energy to be to eliminated, and thus it causes a significant reduction of energy consumption by the apparatus. The use of an additional sampling capacitor for accumulation the converted charge allows a means of controlling apparatus operation to be simplified. Accumulation of charge in the additional sampling capacitor and at the same time in the capacitor having the highest capacitance value in the array of capacitors allows the required capacitance value of the sampling capacitor to be reduced twice with the same maximum value of voltage obtained on the sampling capacitor. Moreover, it also allows the duration of transfer of charge accumulated in the sampling capacitor to subsequent capacitors in the array to be decreased.

The solution according to the invention is presented in the following figures.

FIG. 1—illustrates the block diagram of the apparatus.

Figure 2:
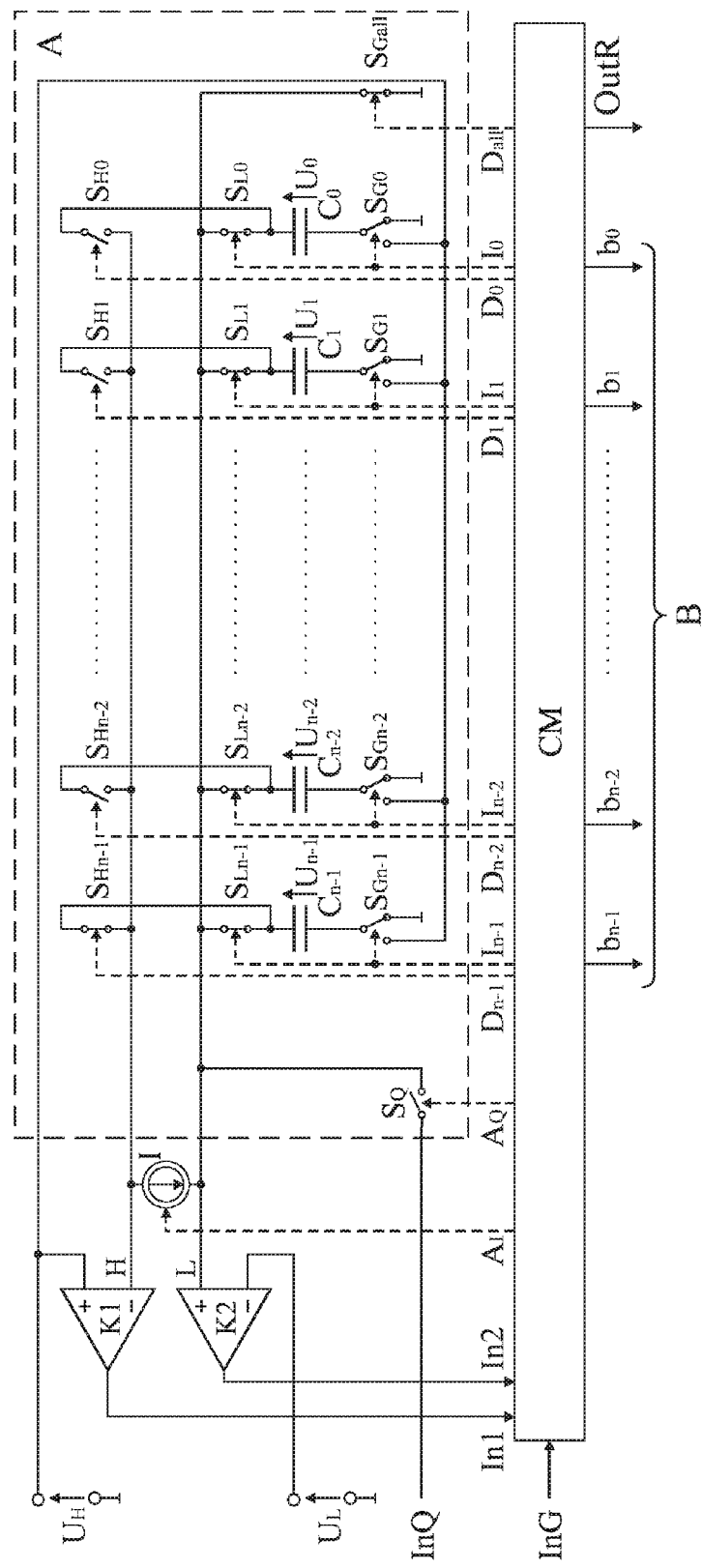

FIG. 2—illustrates the schematic diagram of the apparatus in the relaxation phase.

Figure 3:
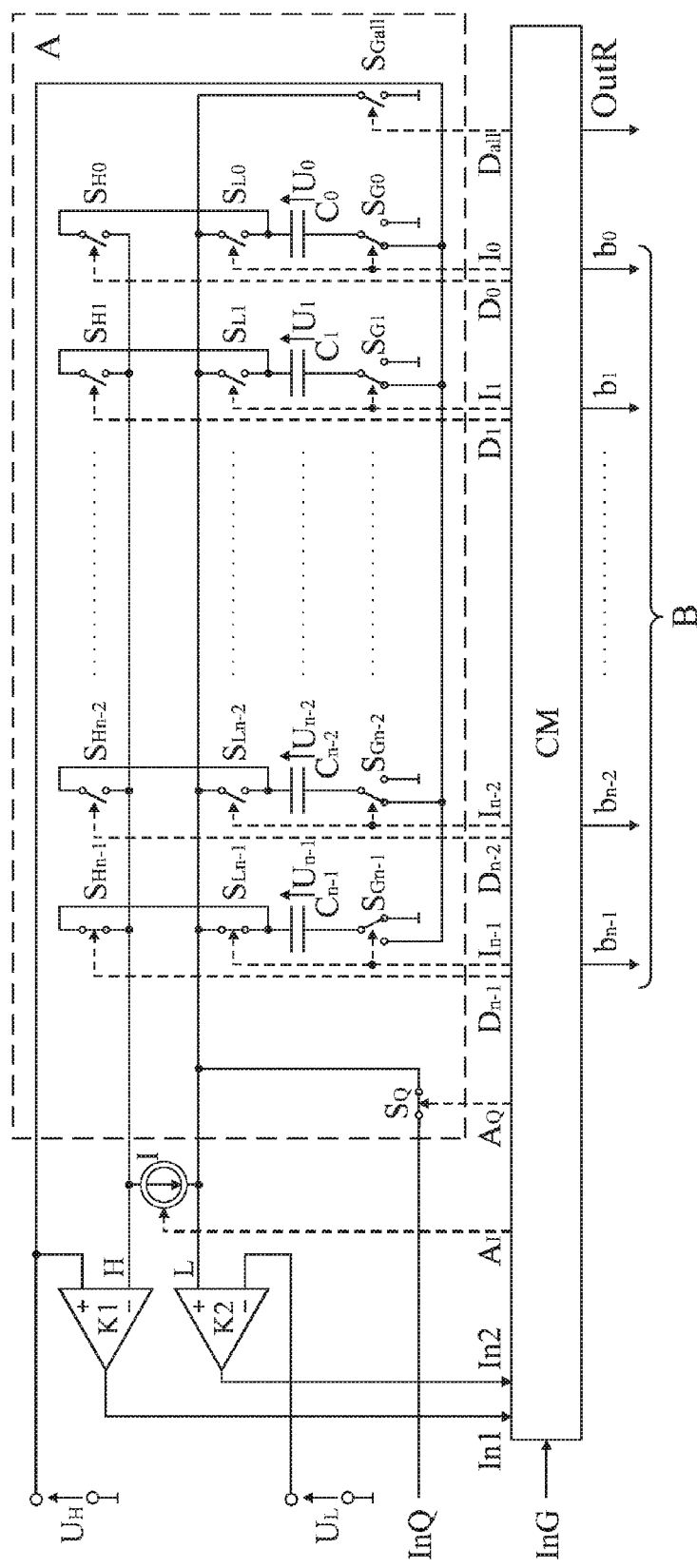

FIG. 3—illustrates the schematic diagram of the apparatus at time of starting the charge accumulation in the capacitor $C_{n-1}$ in the array of capacitors.

Figure 4:
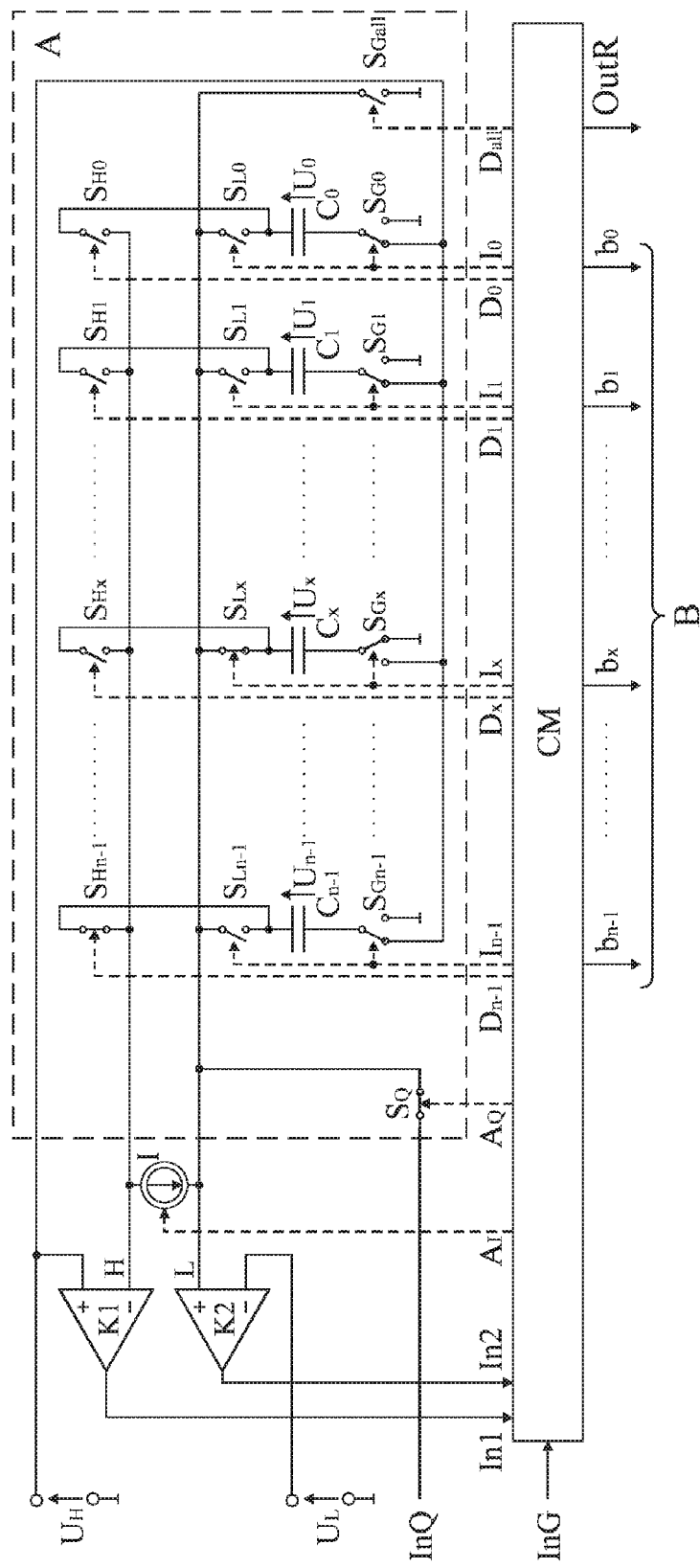

FIG. 4—illustrates the schematic diagram of the apparatus during the accumulation of charge in the subsequent capacitor $C_x$ in the array of capacitors.

Figure 5:
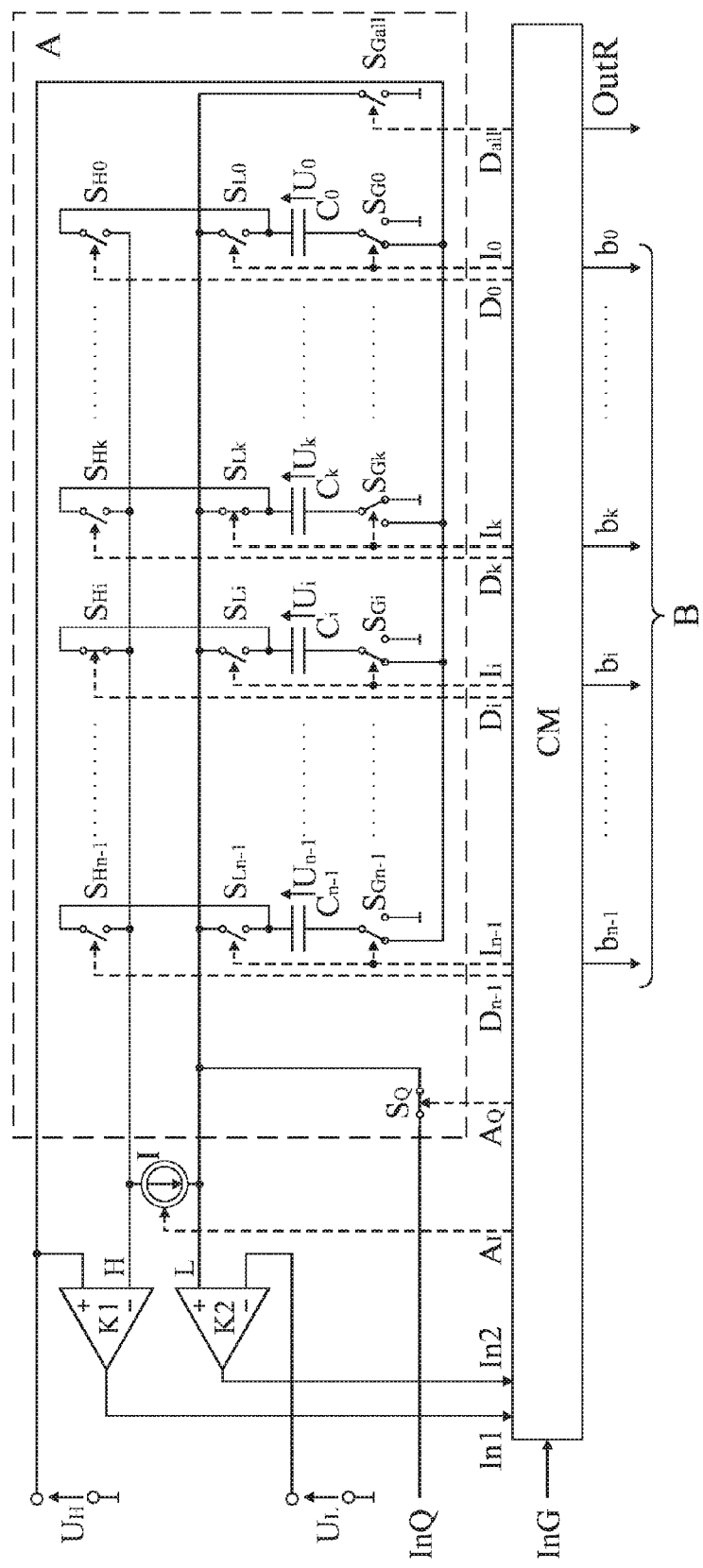

FIG. 5—illustrates the schematic diagram of the apparatus during the transfer of charge from the source capacitor $C_i$ to the destination capacitor $C_k$ in the array of capacitors.

Figure 6:
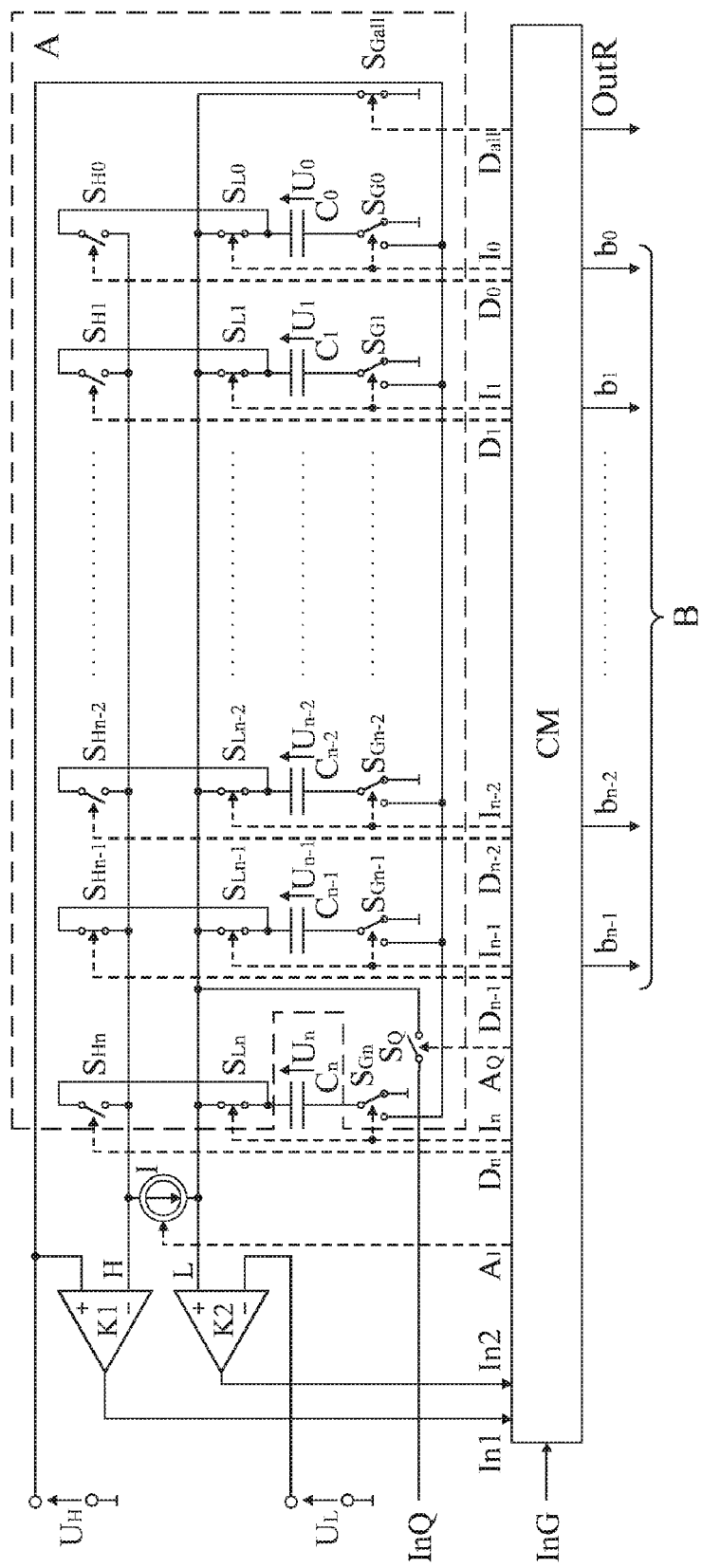

FIG. 6—illustrates the schematic diagram of the another variant of the apparatus with the sampling capacitor $C_n$ in the relaxation phase.

Figure 7:
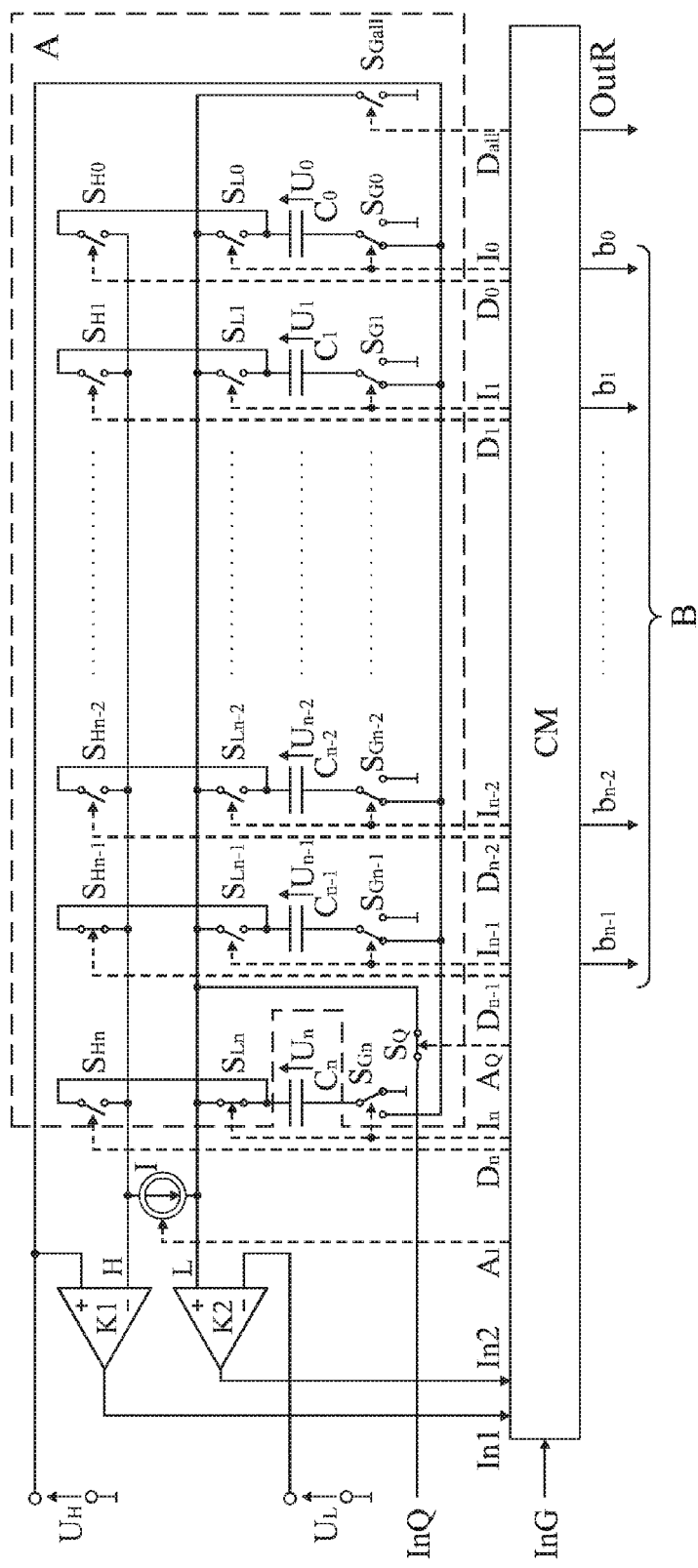

FIG. 7—illustrates the schematic diagram of the another variant of the apparatus at time of starting the charge accumulation in the sampling capacitor $C_n$.

Figure 8:
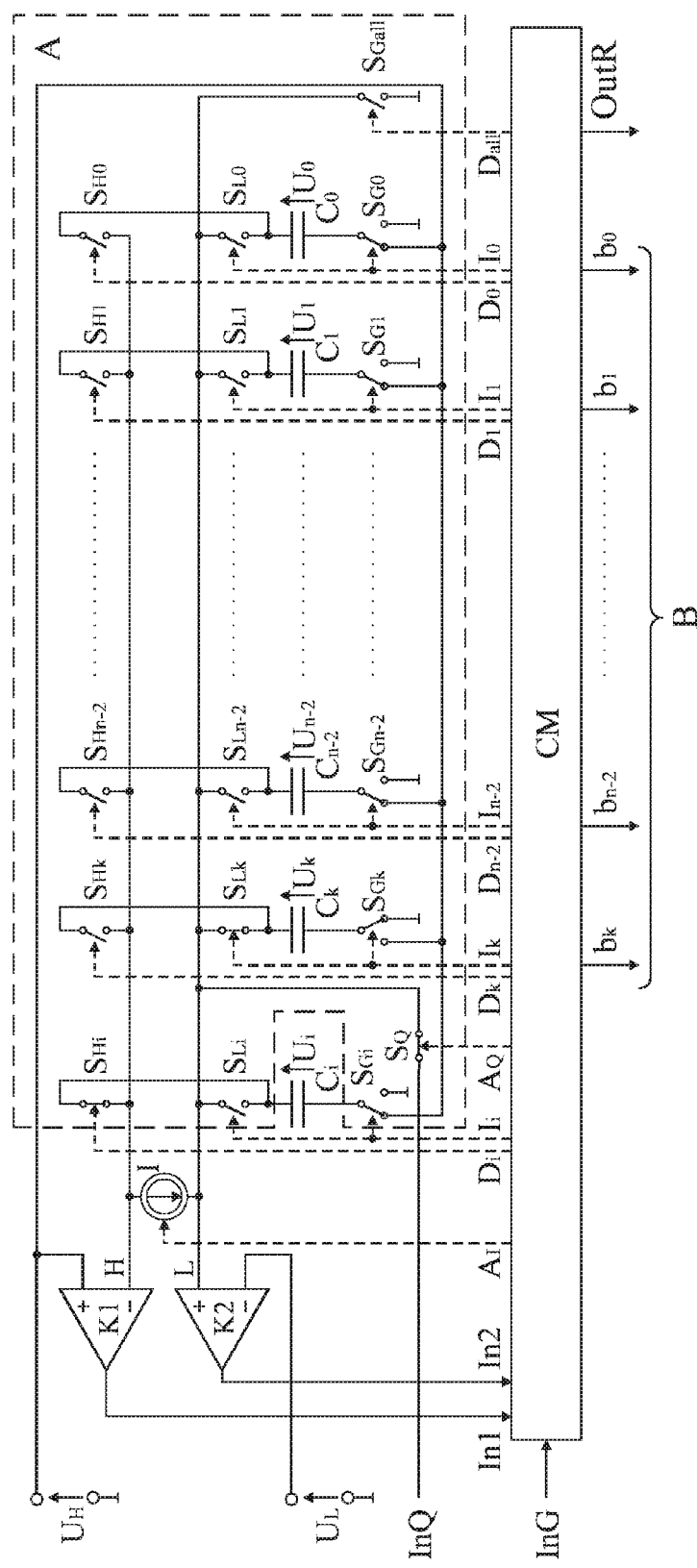

FIG. 8—illustrates the schematic diagram of the another variant of the apparatus at time of starting the charge transfer from the source capacitor $C_i$ to the destination capacitor $C_k$ for $i=n$ and $k=n-1$.

Figure 9:
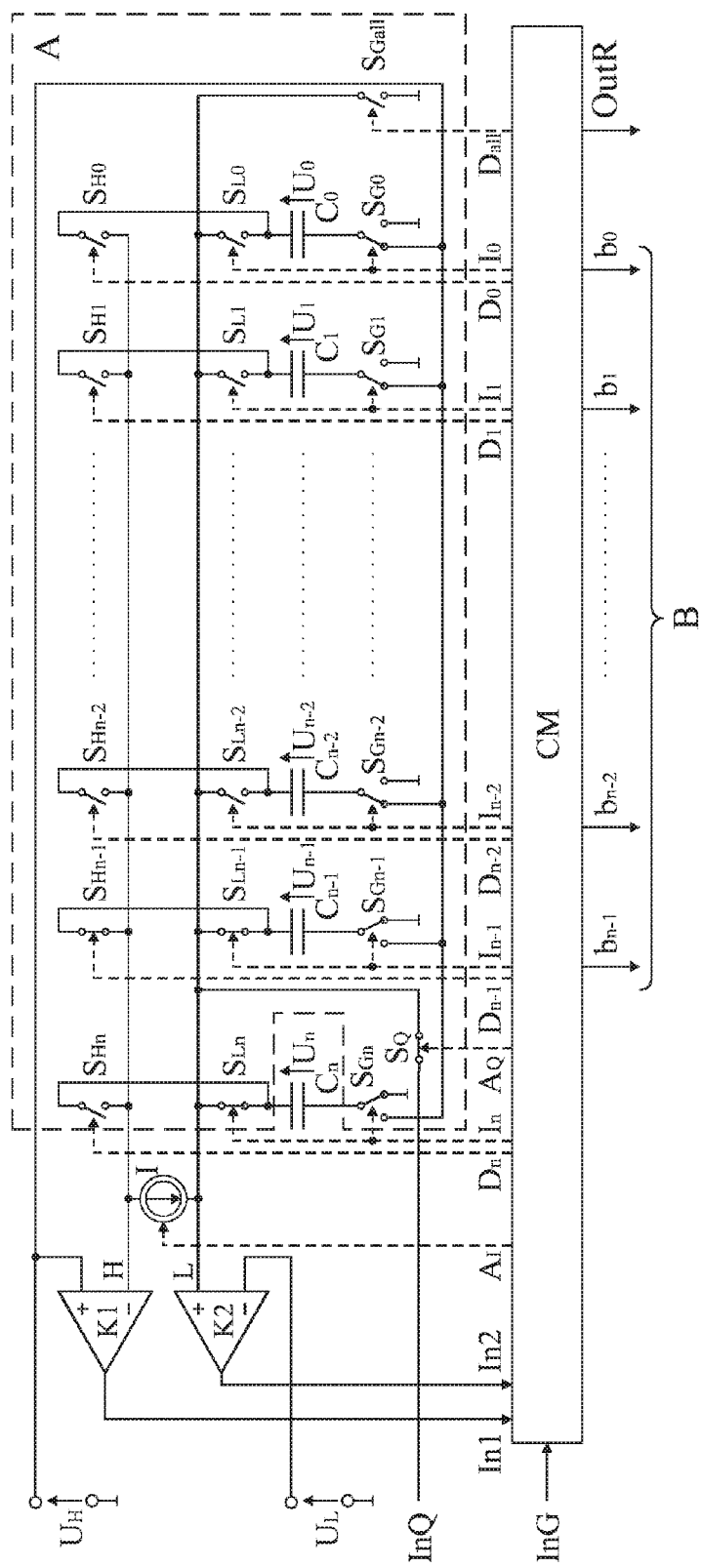

FIG. 9—illustrates the schematic diagram of the another variant of the apparatus at time of starting the charge accumulation both in the sampling capacitor $C_n$ and in the capacitor $C_{n-1}$ connected in parallel.

The method according to the invention consists in that electric charge is accumulated in an array A of capacitors $C_{n-1}, C_{n-2}, \ldots, C_1, C_0$ while a capacitance value of a capacitor of a given index is twice as high as a capacitance value of the capacitor of the previous index. Charge accumulation is started from the capacitor $C_{n-1}$ having the highest capacitance value in the array A of capacitors and is realized during the active state of the gate signal detected by means of the control module CM or until the voltage $U_{n-1}$, which increases on the capacitor $C_{n-1}$ and is simultaneously observed by the use of the second comparator K2, equals the reference voltage $U_L$ value. In this case the charge accumulation is continued in the subsequent capacitor in the array A of capacitors whose capacitance value is twice lower than the capacitance value of the capacitor in which charge was accumulated directly before, and at the same time the voltage, increasing on the capacitor in which charge is accumulated currently, is compared to the reference voltage $U_L$ value by the use of the second comparator K2. The cycle is repeated until the active state of the gate signal detected by means of the control module CM is terminated. Afterwards, the function of the source capacitor $C_i$, whose index is defined by the content of the source capacitor $C_i$ index register in the control module CM, is assigned by means of the control module CM to the capacitor $C_x$ in the array A of capacitors by writing the value of the index of the capacitor $C_x$ to the source capacitor $C_i$ index register where the capacitor $C_x$ is the last capacitor in which charge was accumulated, and the function of the destination capacitor $C_k$ whose index is defined by the content of the destination capacitor $C_k$ index register in the control module CM is assigned by means of the control module CM to the subsequent capacitor in the array A whose capacitance value is twice lower than the capacitance value of the source capacitor $C_i$ by writing the value stored in the source capacitor $C_i$ index register reduced by one to the destination capacitor $C_k$ index register. Then, the electric charge accumulated in the source capacitor $C_i$ is transferred to the destination capacitor $C_k$ by the use of the current source I and at the same time the voltage $U_k$ increasing on the destination capacitor $C_k$ is compared to the reference voltage $U_L$ value by the use the second comparator K2, and also the voltage $U_i$ on the source capacitor $C_i$ is observed by the use of the first comparator K1.

When the voltage $U_i$ on the source capacitor $C_i$ observed by the use of the first comparator K1 equals zero during the charge transfer, the function of the source capacitor $C_i$ is assigned to the current destination capacitor $C_k$ by means of the control module CM on the basis of the output signal of the first comparator K1 by writing the current content of the destination capacitor $C_k$ index register in the control module CM to the source capacitor $C_i$ index register in the control module CM, and the function of the destination capacitor $C_k$ is assigned to the subsequent capacitor in the array A whose capacitance value is twice lower than the capacitance value of the capacitor that operated as the destination capacitor directly before by reducing the content of the destination capacitor $C_k$ index register by one, and charge transfer from a new source capacitor $C_i$ to a new destination capacitor $C_k$ is continued by the use of the current source I. When the voltage $U_k$ on the destination capacitor $C_k$ observed by the use of the second comparator K2 equals the reference voltage $U_L$ value during the transfer of charge from the source capacitor $C_i$ to the destination capacitor $C_k$, the function of the destination capacitor $C_k$ is assigned by means of the control module CM on the basis of the output signal of the second comparator K2 to the subsequent capacitor in the array A whose capacitance value is twice lower than the capacitance value of the capacitor that operated as the destination capacitor directly before by reducing the content of the destination capacitor $C_k$ index register by one, and the charge transfer from the current source capacitor $C_i$ to a new destination capacitor $C_k$ is continued. The process of charge transfer is still controlled by means of the control module CM on the basis of the output signals of the comparators K1 and K2 until the voltage $U_i$ on the source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$ increasing on the capacitor $C_0$ and observed at the same time by the use of the second comparator K2 equals the reference voltage $U_L$ value while the value one is assigned to these bits $b_{n-1}, b_{n-2}, \ldots, b_1, b_0$ in the digital word corresponding to the capacitors $C_{n-1}, C_{n-2}, \ldots, C_1, C_0$ in the array A of capacitors on which the voltage equal to the reference voltage $U_L$ value has been obtained, and the value zero is assigned to the other bits by means of the control module CM.

In the another variant of the method, electric charge is accumulated in the sampling capacitor $C_n$ during the active state of the gate signal detected by means of the control module CM, and after detecting the end of the active state of the gate signal by means of the control module CM, the function of the source capacitor $C_i$ whose index is defined by the content of the source capacitor $C_i$ index register in the control module CM is assigned by means of the control module CM to the sampling capacitor $C_n$ by writing the value of the index of the sampling capacitor $C_n$ to the source capacitor $C_i$ index register. On the other hand, the function of the destination capacitor $C_k$ whose index is defined by the content of the destination capacitor $C_k$ index register in the control module CM is assigned by means of the control module CM to the capacitor $C_{n-1}$ having the highest capacitance value in the array A of capacitors by writing the value of the index of the capacitor $C_{n-1}$ to the destination capacitor $C_k$ index register, and after that the process of electric charge transfer from the source capacitor $C_i$ to the destination capacitor $C_k$ is realized by the use of the current source I on the basis of the output signals of the comparators K1 and K2 until the voltage $U_i$ on the source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$, which increases on the capacitor $C_0$ and is simultaneously observed by the use of the second comparator K2, equals the reference voltage $U_L$ value.

In the another variant of the method, electric charge is accumulated during the active state of the gate signal detected by means of the control module CM in the capacitor $C_{n-1}$ having the highest capacitance value in the array A of capacitors and at the same time in the sampling capacitor $C_n$ connected in parallel to the capacitor $C_{n-1}$ in the array A of capacitors where the capacitance value of the sampling capacitor $C_n$ is not smaller than the capacitance value of the capacitor $C_{n-1}$. After detecting the end of the active state of the gate signal by means of the control module CM, the function of the source capacitor $C_i$ whose index is defined by the content of the source capacitor $C_i$ index register in the control module CM is assigned by means of the control module CM to the sampling capacitor $C_n$ by writing the value of the index of the sampling capacitor $C_n$ to the source capacitor $C_i$ index register, and also the function of the destination capacitor $C_k$ whose index is defined by the content of the destination capacitor $C_k$ index register in the control module CM is assigned by means of the control module CM to the capacitor $C_{n-1}$ in the array A of capacitors by writing the value of the index of the capacitor $C_{n-1}$ in the array A of capacitors to the destination capacitor $C_k$ index register. Afterwards, the process of the electric charge transfer from the source capacitor $C_i$ to the destination capacitor $C_k$ is realized by the use of the current source I on the basis of the output signals of the comparators K1 and K2 until the voltage $U_i$ on the source capacitor $C_i$ observed by the use of the first comparator K1 equals zero during the period in which the function of the destination capacitor $C_k$ is assigned to the capacitor $C_0$ having the lowest capacitance value in the array A of capacitors, or the voltage $U_0$, which increases on the capacitor $C_0$ and is simultaneously observed by the use of the second comparator K2, equals the reference voltage $U_L$ value.

The apparatus according to the invention comprises the array A of capacitors to which the charge input InQ and the set of control outputs E of the control module CM are connected. The control module CM is equipped with the digital output B, the complete conversion signal output OutR, the gate signal input InG and two control inputs In1 and In2 where the first control input In1 is connected to the output of the first comparator K1 whose inputs are connected to one pair of outputs of the array A of capacitors, and the other control input In2 of the control module CM is connected to the output of the second comparator K2 whose inputs are connected to the other pair of outputs of the array A. Furthermore, the source of auxiliary voltage $U_H$ together with the source of the reference voltage $U_L$ and the controlled current source I are connected to the array A of capacitors, and the control input of the controlled current source I is connected to the control output $A_I$ of the control module CM. The array A of capacitors comprises a number of n capacitors $C_{n-1}, C_{n-2}, \ldots, C_1, C_0$, and a capacitance value of a capacitor of a given index is twice as high as a capacitance value of the capacitor of the previous index while a relevant bit $b_{n-1}, b_{n-2}, \ldots, b_1, b_0$ in the digital output B of the control module CM is assigned to each capacitor $C_{n-1}, C_{n-2}, \ldots, C_1, C_0$. The top plate of the capacitor $C_{n-1}$ having the highest capacitance value in the array A of capacitors is connected through the closed first on-off switch $S_{Ln-1}$ to the first rail L with which the top plates of the other capacitors $C_{n-2}, \ldots, C_1, C_0$ in the array A of capacitors are connected through the open first on-off switches $S_{Ln-2}, \ldots, S_{L1}, S_{L0}$. The top plate of the capacitor $C_{n-1}$ is also connected through the closed second on-off switch $S_{Hn-1}$ to the second rail H with which the top plates of the other capacitors $C_{n-2}, \ldots, C_1, C_0$ in the array A are connected through the open second on-off switches $S_{Hn-2}, \ldots, S_{H1}, S_{H0}$. The bottom plate of the capacitor $C_{n-1}$ is connected to the ground of the circuit through the change-over switch $S_{Gn-1}$ whose moving contact is connected to its first stationary contact and the other stationary contact of the change-over switch $S_{Gn-1}$ is connected to the source of auxiliary voltage $U_H$ and also to the non-inverting input of the first comparator K1 while the bottom plates of the other capacitors $C_{n-2}, \ldots, C_1, C_0$ in the array A are connected to the source of auxiliary voltage $U_H$ through the change-over switches $S_{G-2}, \ldots, S_{G1}, S_{G0}$ whose moving contacts are connected to their other stationary contacts, and the first stationary contacts of the change-over switches $S_{Gn-2}, \ldots, S_{G1}, S_{G0}$ are connected to the ground of the circuit. The first rail L is connected to the ground of the circuit through the open first rail on-off switch $S_{Gall}$ and to the non-inverting input of the second comparator K2 whose inverting input is connected to the source of the reference voltage $U_L$ while the second rail H is connected to the inverting input of the first comparator K1, and moreover, the control inputs of the first on-off switches $S_{Ln-1}, S_{Ln-2}, \ldots, S_{L1}, S_{L0}$ and the control inputs of the change-over switches $S_{Gn-1}, S_{Gn-2}, \ldots, S_{G1}, S_{G0}$ in the array A are coupled together and connected to the relevant control outputs $I_{n-1}, I_{n-2}, \ldots, I_1, I_0$ of the set of control outputs E of the control module CM while the control inputs of the second on-off switches $S_{Hn-1}, S_{Hn-2}, \ldots, S_{H1}, S_{H0}$ and the control input of the first rail on-off switch $S_{Gall}$ are connected to the relevant control outputs $D_{n-1}, D_{n-2}, \ldots, D_1, D_0$ and $D_{all}$ of the set of control outputs E of the control module CM. The charge input InQ is connected to the first rail L through the closed input on-off switch $S_Q$ whose control input is connected to the control output $A_Q$ of the control module CM, whereas one end of the current source I is connected to the second rail H, and its other end of the current source I is connected to the first rail L, and the control input of the current source I is connected to the control output $A_I$ of the control module CM.

In the another variant of the apparatus, the sampling capacitor $C_n$ is connected to the array A of capacitors while the top plate of the sampling capacitor $C_n$ is connected to the first rail L through the closed first on-off switch $S_{Ln}$ and also it is connected to the second rail H through the open second on-off switch $S_{Hn}$. On the other hand, the bottom plate of the sampling capacitor $C_n$ is connected to the ground of the circuit through the change-over switch $S_{Gn}$ whose moving contact is connected to its first stationary contact, and the other stationary contact of the change-over switch $S_{Gn}$ is connected to the source of auxiliary voltage $U_H$. The control input of the first on-off switch $S_{Ln}$ and the control input of the change-over switch $S_{Gn}$ are coupled together and connected to the control output $I_n$ of the control module CM, whereas the control input of the second on-off switch $S_{Hn}$ is connected to the control output $D_n$ of the control module CM. Also the top plate of the capacitor $C_{n-1}$ having the highest capacitance value in the array A of capacitors is connected to the first rail L through the open first on-off switch $S_{Ln-1}$ and to the second rail H through the closed second on-off switch $S_{Hn-1}$ while the bottom plate of the capacitor $C_{n-1}$ is connected to the source of auxiliary voltage $U_H$ through the change-over switch $S_{Gn-1}$ whose moving contact is connected to its other stationary contact, whereas the first stationary contact of the change-over switch $S_{Gn-1}$ is connected to the ground of the circuit.

In the another variant of the apparatus, the sampling capacitor $C_n$ is connected to the array A of capacitors where the capacitance value of the sampling capacitor $C_n$ is not smaller than the capacitance value of the capacitor $C_{n-1}$ having the highest capacitance value in the array A of capacitors while the sampling capacitor $C_n$ is connected in parallel to the capacitor $C_{n-1}$ in the array A of capacitors through the first rail L and through the ground of the circuit in a way that the top plate of the sampling capacitor $C_n$ is connected to the first rail L through the closed first on-off switch $S_{Ln}$, and on the other hand the bottom plate of the sampling capacitor $C_n$ is connected to the ground of the circuit through the change-over switch $S_{Gn}$ whose moving contact is connected to its first stationary contact, and the other stationary contact of the change-over switch $S_{Gn}$ is connected to the source of auxiliary voltage $U_H$. Moreover, the top plate of the sampling capacitor $C_n$ is connected also to the second rail H through the open second on-off switch $S_{Hn}$, whereas the control input of the first on-off switch $S_{Ln}$ and the control input of the change-over switch $S_{Gn}$ are coupled together and connected to the control output $I_n$ of the control module CM, and the control input of the second on-off switch $S_{Hn}$ is connected to the control output $D_n$ of the control module CM.

The apparatus according to the invention operates as follows.

Between successive cycles of conversion of electric charge portions to digital words having a number of bits equal to n, the control module CM keeps the apparatus in the state of relaxation during which the control module CM causes, by means of the control signals provided on the outputs $I_{n-1}, I_{n-2}, \ldots, I_1, I_0$, the closure of the first on-off switches $S_{Ln-1}, S_{Ln-2}, \ldots, S_{L1}, S_{L0}$ and thereby the connection of the top plates of all the capacitors $C_{n-1}, C_{n-2}, \ldots, C_1, C_0$ in the array A to the rail L, and also the switching of the change-over switches $S_{Gn-1}, S_{Gn-2}, \ldots, S_{G1}, S_{G0}$ and thereby the connection of the bottom plates of the capacitors $C_{n-1}, C_{n-2}, \ldots, C_1, C_0$ to the ground of the circuit. On the other hand, by means of the control signal provided on the output $D_{all}$, the control module CM causes the closure of the first rail on-off switch $S_{Gall}$ and thereby the connection of the first rail L to the ground of the circuit enforcing in this way a complete discharge of the capacitors $C_{n-1}, C_{n-2}, \ldots, C_1, C_0$ in the array A. Afterwards, the control module CM causes, by means of the control signal provided on the output $D_{n-1}$, the closure of the second on-off switch $S_{Hn-1}$ and thereby the connection of the second rail H to the first rail L and to the ground of the circuit which prevents the occurrence of a random potential on the second rail H. At the same time, the control module CM causes, by means of the control signals provided on the outputs $D_{n-2}, \ldots, D_1, D_0$, the opening of the second on-off switches $S_{Hn-2}, \ldots, S_{H1}, S_{H0}$. Moreover, by means of the control signal provided on the output $A_Q$, the control module CM causes the opening of the input on-off switch $S_Q$ and thereby the disconnection of the charge input InQ from the rail L while by means of the control signal provided on the output $A_I$, the control module CM causes the switching off the current source I (FIG. 2).

As soon as the control module CM detects the beginning of the active state of the gate signal on the gate signal input InG of the apparatus, the control module CM causes, by means of the control signal provided on the output $D_{all}$, the opening of the first rail on-off switch $S_{Gall}$ and thereby the disconnection of the first rail L from the ground of the circuit. At the same time, the control module CM causes, by means of the control signals provided on the outputs $I_{n-2}, \ldots, I_1, I_0$, the opening of the first on-off switches $S_{Ln-2}, \ldots, S_{L1}, S_{L0}$ and thereby the disconnection of the top plates of the capacitors $C_{n-2}, \ldots, C_1, C_0$ in the array A from the rail L and also the switching of the change-over switches $S_{Gn-2}, \ldots, S_{G1}, S_{G0}$ and thereby the connection of the bottom plates of the capacitors $C_{n-2}, \ldots, C_1, C_0$ to the source of auxiliary voltage $U_H$. At the same time, the control module CM causes, by means of the control signal provided on the output $A_Q$, the closure of the input on-off switch $S_Q$ and thereby the connection of the electric input InQ to the first rail L. At the same time, the control module CM deactivates the signal provided on the complete conversion signal output OutR and assigns the initial value zero to all the bits $b_{n-1}, b_{n-2}, \ldots, b_1, b_0$ in the digital word. At the same time, the control module CM assigns the function of the charge collecting capacitor $C_x$ to the capacitor $C_{n-1}$ having the highest capacitance value in the array A where the index of the charge collecting capacitor $C_x$ is defined by the content of the destination capacitor $C_k$ index register in the control module CM by writing the value of the index of the capacitor $C_{n-1}$ to the destination capacitor $C_k$ index register (FIG. 3).

The electric charge delivered to the charge input InQ of the apparatus is accumulated at first in the capacitor $C_{n-1}$ in the array A which is the only capacitor connected at that time to the charge input InQ through the first rail L and through the closed first on-off switch $S_{Ln-1}$. Accumulation of charge in the capacitor $C_x$ causes a progressive increase of the voltage $U_x$ on that capacitor. The voltage $U_x$ is compared to the reference voltage $U_L$ of a fixed value by the second comparator K2.

When the voltage $U_x$ on the capacitor $C_x$, in which the charge is accumulated, reaches the reference voltage $U_L$ value during the still active state of the gate signal on the gate signal input InG of the apparatus, the control module CM assigns the value one to the bit $b_x$ of the digital word on the output B of the apparatus on the basis of the output signal of the second comparator K2. At the same time, the control module CM causes, by means of the control signal provided on the output $I_x$, the opening of the first on-off switch $S_{Lx}$ and thereby the disconnection of the top plate of the charged capacitor $C_x$ from the rail L, and also the concurrent switching of the change-over switch $S_{Gx}$ and thereby the connection of the bottom plate of the capacitor $C_x$ to the source of auxiliary voltage $U_H$. Next, by reduction of the content of the destination capacitor $C_k$ index register by one, the control module CM assigns the function of the charge collecting capacitor $C_x$ to the subsequent capacitor in the array A having the capacitance value twice as lower as the capacitance value of the capacitor which acted as the charge collecting capacitor directly before. Afterwards, the control module CM causes, by means of the control signal provided on the output $I_x$, the closure of the first on-off switch $S_{Lx}$ and thereby the connection of the top plate of the capacitor $C_x$ through the rail L to the charge input InQ, and also the concurrent switching of the change-over switch $S_{Gx}$ and thereby the connection of the bottom plate of the capacitor $C_x$ to the ground of the circuit. The electric charge delivered to the charge input InQ of the apparatus is then accumulated in the subsequent capacitor $C_x$ which is the only capacitor connected at that time to the charge input InQ through the rail L and through the closed first on-off switch $S_{Lx}$ (FIG. 4).

Each time the voltage $U_x$ increasing on the capacitor $C_x$ reaches the reference voltage $U_L$ value during the still active state of the gate signal on the gate signal input InG of the apparatus, which is signaled to the control module CM by the second comparator K2, the cycle is repeated each time with the subsequent capacitor in the array A having the capacitance value twice as lower as the capacitance value of the capacitor which acted as the function of the charge collecting capacitor directly before.

When the control module CM detects that the gate signal on the gate signal input InG of the apparatus has changed its state to the inactive state during accumulation of charge in the capacitor $C_x$, the control module CM causes, by means of the control signal provided on the output $A_Q$, the opening of the input on-off switch $S_Q$ and thereby the disconnection of the charge input InQ from the rail L. At the same time, the control module CM causes, by means of the control signal provided on the output $I_x$, the opening of the first on-off switch $S_{Lx}$ and thereby the disconnection of the top plate of the capacitor $C_x$ from the rail L, and also the concurrent switching of the change-over switch $S_{Gx}$ and thereby the connection of the bottom plate of the capacitor $C_x$ to the source of auxiliary voltage $U_H$. At the same time, the control module CM causes, by means of the control signal provided on the output $D_{n-1}$, the opening of the second on-off switch $S_{Hn-1}$ and thereby the disconnection of the top plate of the capacitor $C_{n-1}$ from the rail H. Next, by writing the content of the destination capacitor $C_k$ index register to the source capacitor $C_i$ index register in the control module CM, the control module CM assigns the function of the source capacitor $C_i$ whose index is defined by the content of the source capacitor $C_i$ index register, to the capacitor $C_x$ which accumulated charge as the last capacitor. At the same time, the control module CM causes, by means of the control signal provided on the output $D_i$, the closure of the second on-off switch $S_{Hi}$ and thereby the connection of the top plate of the source capacitor $C_i$ to the rail H. Afterwards, by reduction of the content of the destination capacitor $C_k$ index register by one, the control module CM assigns the function of the destination capacitor $C_k$, whose index is defined by the content of the destination capacitor $C_k$ index register in the control module CM, to the subsequent capacitor in the array A, whose capacitance value is twice as lower as the capacitance value of the source capacitor $C_i$. Then, the control module CM causes, by means of the control signal provided on the output $I_k$, the closure of the first on-off switch $S_{Lk}$ and thereby the connection of the top plate of the destination capacitor $C_k$ to the rail L, and also the concurrent switching of the change-over switch $S_{Gk}$ and thereby the connection of the bottom plate of the destination capacitor $C_k$ to the ground of the circuit. Next, the control module CM causes, by means of the control signal provided on the output $A_I$, the switching on the current source I by the use of which the charge accumulated in the source capacitor $C_i$ is transferred through the rail H and through the rail L to the destination capacitor $C_k$ (FIG. 5). During the charge transfer, the voltage $U_i$ on the source capacitor $C_i$ progressively decreases whereas at the same time the voltage $U_i$ on the destination capacitor $C_k$ progressively increases. In case when the voltage $U_k$ on the current destination capacitor $C_k$ reaches the reference voltage $U_L$ value during the charge transfer, the control module CM on the basis of the output signal of the second comparator K2 assigns the value one to the relevant bit $b_k$ in the digital word, and the control module CM causes, by means of the control signal provided on the output $I_k$, the opening of the first on-off switch $S_{Lk}$ and thereby the disconnection of the top plate of the destination capacitor $C_k$ from the rail L and also the concurrent switching of the change-over switch $S_{Gk}$ and thereby the connection of the bottom plate of the destination capacitor $C_k$ to the source of auxiliary voltage $U_H$. Afterwards, by reduction of the content of the destination capacitor $C_k$ index register by one, the control module CM assigns the function of the destination capacitor $C_k$ to the subsequent capacitor in the array A, whose capacitance value is twice as lower as the capacitance value of the capacitor, which acted as the destination capacitor directly before. After that, the control module CM causes, by means of the control signal provided on the output $I_k$, the closure of the first on-off switch $S_{Lk}$ and thereby the connection of the top plate of a new destination capacitor $C_k$ to the rail L, and also the concurrent switching of the change-over switch $S_{Gk}$ and thereby the connection of the bottom plate of the destination capacitor $C_k$ to the ground of the circuit.

In case when the voltage $U_i$ on the source capacitor $C_i$ reaches the value zero during the charge transfer, the control module CM on the basis of the output signal of the first comparator K1 causes by means of the control signal provided on the output $D_i$, the opening of the second on-off switch $S_{Hi}$ and thereby the disconnection of the top plate of the source capacitor $C_i$ from the rail H. At the same time, the control module CM causes, by means of the control signal provided on the output $I_k$, the opening of the first on-off switch $S_{Lk}$ and thereby the disconnection of the top plate of the destination capacitor $C_k$ from the rail L and also the concurrent switching of the change-over switch $S_{Gk}$ and thereby the connection of the bottom plate of the destination capacitor $C_k$ to the source of auxiliary voltage $U_H$. Next, the control module CM, on the basis of the output signal of the first comparator K1 by writing the current content of the destination capacitor $C_k$ index register to the source capacitor $C_i$ index register, assigns the function of the source capacitor $C_i$ to the capacitor that until now has acted as the destination capacitor $C_k$, and after that, the control module CM causes, by means of the control signal provided on the output $D_i$, the closure of the second on-off switch $S_{Hi}$ and thereby the connection of the top plate of a new source capacitor $C_i$ to the rail H. Afterwards, by reduction of the content of the destination capacitor $C_k$ index register by one, the control module CM assigns the function of the destination capacitor $C_k$, whose index is defined by the content of the destination capacitor $C_k$ index register in the control module CM, to the subsequent capacitor in the array A whose capacitance value is twice as lower as the capacitance value of the source capacitor $C_i$. After that, the control module CM causes, by means of the control signal provided on the output $I_k$, the closure of the first on-off switch $S_{Lk}$ and thereby the connection of the top plate of a new destination capacitor $C_k$ to the rail L, and also the concurrent switching of the change-over switch $S_{Gk}$ and thereby the connection of the bottom plate of a new destination capacitor $C_k$ to the ground of the circuit.

In both cases the control module CM continues to control the process of charge transfer on the basis of the output signals of both comparators K1 and K2. Each occurrence of the active state on the output of second comparator K2 causes the assignment of the function of the destination capacitor $C_k$ to the subsequent capacitor in the array A whose capacitance value is twice as lower as the capacitance value of the capacitor, which acted as the destination capacitor directly before. On the other hand, each occurrence of the active state on the output of first comparator K1 causes the assignment of the function of the source capacitor $C_i$ to the capacitor that until now has acted as the destination capacitor $C_k$, and at the same time the assignment of the function of the destination capacitor $C_k$ to the subsequent capacitor in the array A whose capacitance value is twice as lower as the capacitance value of the capacitor which acted as the destination capacitor directly before.

The process of charge redistribution is terminated when the capacitor $C_0$ having the lowest capacitance value in the array A stops to act as the destination capacitor $C_k$. Such situation occurs when the active state appears on the output of the first comparator K1 or on the output of the second comparator K2 during charge transfer to the capacitor $C_0$. When the active state appears on the output of the second comparator K2, the control module CM assigns the value one to the bit $b_0$. After termination of redistribution of electric charge accumulated in the capacitors in the array A during the active state of the gate signal, and after assigning the corresponding values to the bits $b_{n-1}, b_{n-2}, \ldots, b_1, b_0$ in the output digital word, the control module CM activates the signal provided on the complete conversion signal output OutR and causes introduction of the apparatus into the relaxation phase by switching off the current source I. At the same time, the control module causes the closure of the first on-off switches $S_{Ln-1}, S_{Ln-2}, \ldots, S_{L1}, S_{L0}$ so and thereby the connection of the top plates of all the capacitors $C_{n-1}, C_{n-2}, \ldots, C_1, C_0$ in the array A to the rail L, and also the concurrent switching of the change-over switches $S_{Gn-1}, S_{Gn-2}, \ldots, S_{G1}, S_{G0}$ to positions connecting the bottom plates of the capacitors $C_{n-1}, C_{n-2}, \ldots, C_1, C_0$ to the ground of the circuit. At the same time, the control module causes the closure of the on-off switch $S_{Gall}$ and thereby the connection of the first rail L to the ground of the circuit, enforcing a complete discharge of the capacitors $C_{n-1}, C_{n-2}, \ldots, C_1, C_0$ in the array A, and also the opening of the second on-off switches $S_{Hn-2}, \ldots, S_{H1}, S_{H0}$ in the array A, the closure of the second on-off switch $S_{Hn-1}$ and thereby the connection of the rail H to the rail L and to the ground of the circuit (FIG. 2) which prevents the occurrence of a random potential on the rail H.

The operation of the another variant of the apparatus consists in that during the time when the apparatus is kept in the state of relaxation, the control module CM causes the connection of the top plate of the sampling capacitor $C_n$ and the top plates of the capacitors $C_{n-1}, C_{n-2}, \ldots, C_1, C_0$ in the array A to the rail L, and the connection of the bottom plate of the sampling capacitor $C_n$ and the connection of the bottom plates of the capacitors $C_{n-1}, C_{n-2}, \ldots, C_1, C_0$ to the ground of the circuit through the closure of the relevant on-off switches and the switching of the relevant change-over switches (FIG. 6) enforcing in this way a complete discharge of the sampling capacitor $C_n$ and of the capacitors $C_{n-1}, C_{n-2}, \ldots, C_1, C_0$. As soon as the control module CM detects the beginning of the active state of the gate signal on the gate signal input InG of the apparatus, the control module CM causes, by means of the control signal provided on the output $D_{all}$, the opening of the first rail on-off switch $S_{Gall}$ and thereby the disconnection of the rail L from the ground of the circuit. At the same time, the control module CM causes, by means of the control signals provided on the outputs $I_{n-1}, I_{n-2}, \ldots, I_1, I_0$, the opening of the first on-off switches $S_{Ln-1}, S_{Ln-2}, \ldots, S_{L1}, S_{L0}$ and thereby the disconnection of the top plates of the capacitors $C_{n-1}, C_{n-2}, \ldots, C_1, C_0$ in the array A from the rail L, and also the switching of the change-over switches $S_{Gn-1}, S_{Gn-2}, \ldots, S_{G1}, S_{G0}$, and thereby the connection of the bottom plates of the capacitors $C_{n-1}, C_{n-2}, \ldots, C_1, C_0$ to the source of auxiliary voltage $U_H$. At the same time, the control module CM causes, by means of the control signal provided on the output $A_Q$, the closure of the input on-off switch $S_Q$ and thereby the connection of the charge input InQ to the rail L (FIG. 7). At the same time, the control module CM deactivates the signal provided on the complete conversion signal output OutR, and assigns the initial value zero to all the bits $b_{n-1}, b_{n-2}, \ldots, b_1, b_0$ in the digital word. The electric charge delivered to the charge input InQ of the apparatus is accumulated in the sampling capacitor $C_n$ which is the only capacitor connected during the active state of the gate signal on the gate signal input InG of the apparatus to the charge input InQ through the rail L and through the closed first on-off switch $S_{Ln}$. When the control module CM detects that the gate signal on the gate signal input InG of the apparatus has changed its state to the inactive state, the control module CM causes, by means of the control signal provided on the output $A_Q$, the opening of the input on-off switch $S_Q$ and thereby the disconnection of the charge input InQ from the rail L. At the same time, the control module CM causes, by means of the control signal provided on the output $I_n$, the opening of the first on-off switch $S_{Ln}$ and thereby the disconnection of the top plate of the sampling capacitor $C_n$ from the rail L, and also the concurrent switching of the change-over switch $S_{Gn}$ and thereby the connection of the bottom plate of the sampling capacitor $C_n$ to the source of auxiliary voltage $U_H$. At the same time, the control module CM causes, by means of the control signal provided on the output $D_{n-1}$, the opening of the second on-off switch $S_{Hn-1}$ and thereby the disconnection of the top plate of the capacitor $C_{n-1}$ in the array A from the rail H (FIG. 8). Next, the control module CM assigns the function of the source capacitor $C_i$ to the sampling capacitor $C_n$ by writing the value of the index of the sampling capacitor $C_n$ to the source capacitor $C_i$ index register in the control module CM. Next, the control module CM causes, by means of the control signal provided on the output $D_i$, the closure of the second on-off switch $S_{Hi}$ and thereby the connection of the top plate of the source capacitor $C_i$ to the rail H. At the same time, the control module CM assigns the function of the destination capacitor $C_k$ to the capacitor $C_{n-1}$ having the highest capacitance value in the array A by writing the value of the index of the capacitor $C_{n-1}$ to the destination capacitor $C_k$ index register in the control module CM. Then, the control module CM causes, by means of the control signal provided on the output $I_k$, the closure of the first on-off switch $S_{Lk}$ and thereby the connection of the top plate of the capacitor $C_k$ to the rail L, and also the concurrent switching of the change-over switch $S_{Gk}$ and thereby the connection of the bottom plate of the destination capacitor $C_k$ to the ground of the circuit. Next, the control module CM causes, by means of the control signal provided on the output $A_I$, the switching on the current source I and a start of the process of charge redistribution which is terminated when the capacitor $C_0$ having the lowest capacitance value in the array A stops to act as the destination capacitor $C_k$. After that the control module CM activates the signal provided on the complete conversion signal output OutR, and causes introducing the apparatus into the relaxation phase again.

The operation of the another variant of the apparatus consists in that during the time when the apparatus is kept in the state of relaxation, the control module CM causes the connection of the top plate of the sampling capacitor $C_n$ and the connection of the top plates of the capacitors $C_{n-1}, C_{n-2}, \ldots, C_1, C_0$ in the array A to the rail L, and the connection of the bottom plate of the sampling capacitor $C_n$ and the connection of the bottom plates of the capacitors $C_{n-1}, C_{n-2}, \ldots, C_1, C_0$ to the ground of the circuit through the closure of the relevant on-off switches and the switching of the relevant change-over switches (FIG. 6) enforcing in this way a complete discharge of the sampling capacitor $C_n$ and of the capacitors $C_{n-1}, C_{n-2}, \ldots, C_1, C_0$.

As soon as the control module CM detects the beginning of the active state of the gate signal on the gate signal input InG of the apparatus, the control module CM causes, by means of the control signal provided on the output $D_{all}$, the opening of the first rail on-off switch $S_{Gall}$ and thereby the disconnection of the rail L from the ground of the circuit. At the same time, the control module CM causes, by means of the control signals provided on the outputs $I_{n-2}, \ldots, I_1, I_0$, the opening of the first on-off switches $S_{Ln-2}, \ldots, S_{L1}, S_{L0}$ and thereby the disconnection of the top plates of the capacitors $C_{n-2}, \ldots, C_1, C_0$ in the array A from the rail L, and also the switching of the change-over switches $S_{Gn-1}, S_{Gn-2}, \ldots, S_{G1}, S_{G0}$ and thereby the connection of the bottom plates of the capacitors $C_{n-1}, C_{n-2}, \ldots, C_1, C_0$ to the source of auxiliary voltage $U_H$. At the same time, the control module CM causes, by means of the control signal provided on the output $A_Q$, the closure of the input on-off switch $S_Q$ and thereby the connection of the charge input InQ to the rail L (FIG. 9). At the same time, the control module CM deactivates the signal provided on the complete conversion signal output OutR, and assigns the initial value zero to all the bits $b_{n-1}, b_{n-2}, \ldots, b_1, b_0$ in the digital word. The electric charge delivered to the charge input InQ of the apparatus is accumulated in the capacitor $C_{n-1}$ having the highest capacitance in the array A of capacitors and at the same time in the sampling capacitor $C_n$ connected in parallel to the capacitor $C_{n-1}$ in the array A of capacitors. The sampling capacitor $C_n$ and the capacitor $C_{n-1}$ in the array A are the only capacitors that are connected during the active state of the gate signal on the gate signal input InG of the apparatus to the charge input InQ through the rail L and through the closed first on-off switches $S_{Ln}$ and $S_{Ln-1}$.

When the control module CM detects that the gate signal on the gate signal input InG of the apparatus has changed its state to the inactive state, the control module CM causes, by means of the control signal provided on the output $A_Q$, the opening of the input on-off switch $S_Q$ and thereby the disconnection of the charge input InQ from the rail L. At the same time, the control module CM causes, by means of the control signal provided on the output $I_n$, the opening of the first on-off switch $S_{Ln}$ and thereby the disconnection of the top plate of the sampling capacitor $C_n$ from the rail L, and also the concurrent switching of the change-over switch $S_{Gn}$ and thereby the connection of the bottom plate of the sampling capacitor $C_n$ to the source of auxiliary voltage $U_H$. At the same time, the control module CM causes, by means of the control signal provided on the output $D_{n-1}$, the opening of the second on-off switch $S_{Hn-1}$ and thereby the disconnection of the top plate of the capacitor $C_{n-1}$ in the array A from the rail H (FIG. 8). Next, the control module CM assigns the function of the source capacitor $C_i$ to the sampling capacitor $C_n$ by writing the value of the index of the sampling capacitor $C_n$ to the source capacitor $C_i$ index register in the control module CM. Next, the control module CM causes, by means of the control signal provided on the output $D_i$, the closure of the second on-off switch $S_{Hi}$ and thereby the connection of the top plate of the source capacitor $C_i$ to the rail H. At the same time, the control module CM assigns the function of the destination capacitor $C_k$ to the capacitor $C_{n-1}$ having the highest capacitance value in the array A by writing the value of the index of the capacitor $C_{n-1}$ to the destination capacitor $C_k$ index register in the control module CM. Next, the control module CM causes, by means of the control signal provided on the output $A_I$, the switching on the current source I and a start of the process of charge redistribution which is terminated when the capacitor $C_0$ having the lowest capacitance value in the array A stops to act as the destination capacitor $C_k$. After that the control module CM activates the signal provided on the complete conversion signal output OutR, and causes introduction of the apparatus into the relaxation phase again.

ABBREVIATIONS

A array of capacitors
CM control module
K1 first comparator
K2 second comparator
I current source
$U_L$ source of the reference voltage
$U_H$ source of auxiliary voltage
InQ charge input
InG gate signal input
In1 first control input of the control module
In2 second control input of the control module
B digital output of the control module
E set of control outputs of the control module
OutR complete conversion signal output
L first rail
H second rail
$C_{n-1}, C_{n-2}, \ldots, C_1, C_0$ capacitors in the array of capacitors
$C_n$ sampling capacitor
$C_x$ charge collecting capacitor
$C_i$ source capacitor
$C_k$ destination capacitor
$U_{n-1}, U_{n-2}, \ldots, U_1, U_0$ voltages on the capacitors in the array of capacitors
$U_n$ voltage on the sampling capacitor
$U_x$ voltage on the charge collecting capacitor
$U_i$ voltage on the source capacitor
$U_k$ voltage on the destination capacitor
$b_{n-1}, b_{n-2}, \ldots, b_x, \ldots, b_1, b_0$ bits in the digital word
$S_{Ln}, S_{Ln-1}, S_{Ln-2}, \ldots, S_{Lx}, \ldots, S_{L1}, S_{L0}$ first on-off switches
$S_{Hn}, S_{Hn-1}, S_{Hn-2}, \ldots, S_{Hx}, \ldots, S_{H1}, S_{H0}$ second on-off switches
$S_{Gn}, S_{Gn-1}, S_{Gn-2}, \ldots, S_{Gx}, \ldots, S_{G1}, S_{G0}$ change-over switches
$S_{Gall}$ first rail on-off switch
$S_Q$ input on-off switch
$A_I, A_Q$ control outputs of the control module
$I_n, I_{n-1}, I_{n-2}, \ldots, I_x, \ldots, I_1, I_0$ control outputs of the control module
$D_n, D_{n-1}, D_{n-2}, \ldots, D_x, \ldots, D_1, D_0, D_{Gall}$ control outputs of the control module

The invention claimed is:

1. A method for conversion of a portion of electric charge to a digital word consisting in accumulation of charge in at least one capacitor and conversion of the portion of electric charge to a digital word having a number of bits equal to n characterized in that electric charge is accumulated in an array (A) of capacitors ($C_{n-1}, C_{n-2}, \ldots, C_1, C_0$) while a capacitance value of a capacitor of a given index is twice as high as a capacitance value of a capacitor of a previous index and charge accumulation is started from a capacitor ($C_{n-1}$) having the highest capacitance value in an array (A) of capacitors and is realized during an active state of a gate signal detected by means of a control module (CM) or until a voltage ($U_{n-1}$), which increases on a capacitor ($C_{n-1}$) and is simultaneously observed by the use of a second comparator (K2), equals a reference voltage ($U_L$) value, and in the latter case the charge accumulation is continued in the subsequent capacitor in the array (A) of capacitors whose capacitance value is twice lower than a capacitance value of the capacitor in which charge had been accumulated directly before, and at the same time a voltage increasing on the capacitor in which charge is accumulated currently is compared to the reference voltage ($U_L$) value by the use of a second comparator (K2), and the cycle is repeated until an active state of the gate signal detected by means of the control module (CM) is terminated, and afterwards a function of a source capacitor ($C_i$), whose index is defined by the content of the source capacitor ($C_i$) index register in the control module (CM), is assigned by means of the control module (CM) to a capacitor ($C_x$) in the array (A) of capacitors by writing a value of an index of the capacitor ($C_x$) to the source capacitor ($C_i$) index register where the capacitor ($C_x$) is the last capacitor in which charge was accumulated, and a function of a destination capacitor ($C_k$) whose index is defined by a content of a destination capacitor ($C_k$) index register in the control module (CM) is assigned by means of the control module (CM) to a subsequent capacitor in the array (A) whose capacitance value is twice lower than the capacitance value of the source capacitor ($C_i$) by writing a value stored in the source capacitor ($C_i$) index register reduced by one to the destination capacitor ($C_k$) index register, and then the electric charge accumulated in the source capacitor ($C_i$) is transferred to the destination capacitor ($C_k$) by the use of a current source (I) and at the same time a voltage ($U_k$) increasing on the destination capacitor ($C_k$) is compared to the reference voltage ($U_L$) value by the use the second comparator (K2), and also a voltage ($U_i$) on the source capacitor ($C_i$) is observed by the use of a first comparator (K1), and when the voltage ($U_i$) on the source capacitor ($C_i$) observed by the use of the first comparator (K1) equals zero during the charge transfer, the function of the source capacitor ($C_i$) is assigned to the current destination capacitor ($C_k$) by means of the control module (CM) on the basis of an output signal of the first comparator (K1) by writing a current content of the destination capacitor ($C_k$) index register in the control module (CM) to the source capacitor ($C_i$) index register in the control module (CM), and also the function of the destination capacitor ($C_k$) is assigned to the subsequent capacitor in the array (A) whose capacitance value is twice lower than the capacitance value of the capacitor that operated as the destination capacitor directly before by reducing the content of the destination capacitor ($C_k$) index register by one, and charge transfer from a new source capacitor ($C_i$) to a new destination capacitor ($C_k$) is continued by the use of the current source (I), and when the voltage ($U_k$) on the destination capacitor ($C_k$) observed by the use of a second comparator (K2) equals the reference voltage ($U_L$) value during the transfer of charge from the source capacitor ($C_i$) to the destination capacitor ($C_k$), the function of the destination capacitor ($C_k$) is assigned by means of the control module (CM) on the basis of the output signal of the second comparator (K2) to the subsequent capacitor in the array (A) whose capacitance value is twice lower than the capacitance value of the capacitor that operated as the destination capacitor directly before by reducing the content of the destination capacitor ($C_k$) index register by one, and also the charge transfer from the source capacitor ($C_i$) to a new destination capacitor ($C_k$) is continued, while this process is still controlled by means of the control module (CM) on the basis of the output signals of the comparators (K1) and (K2) until the voltage ($U_i$) on the source capacitor ($C_i$) observed by the use of the first comparator (K1) equals zero during a period in which the function of the destination capacitor ($C_k$) is assigned to the capacitor ($C_0$) having the lowest capacitance value in the array (A) of capacitors, or the voltage ($U_O$) increasing on the capacitor ($C_O$) and observed at the same time by the use of the second comparator (K2) equals the reference voltage ($U_L$) value while the value one is assigned to these bits in the digital word, corresponding to the capacitors in the array (A) of capacitors, on which the voltage equal to the reference voltage ($U_L$) value has been obtained, and the value zero is assigned to the other bits by means of the control module (CM).

2. The method for conversion as claimed in claim 1 characterized in that electric charge is accumulated in the sampling capacitor ($C_n$) during the active state of the gate signal detected by means of the control module (CM), and after detecting the end of the active state of the gate signal by means of the control module (CM), the function of the source capacitor ($C_i$) whose index is defined by the content of the source capacitor ($C_i$) index register in the control module (CM) is assigned by means of the control module (CM) to the sampling capacitor ($C_n$) by writing the value of the index of the sampling capacitor ($C_n$) to the source capacitor ($C_i$) index register, and also the function of the destination capacitor ($C_k$) whose index is defined by the content of the destination capacitor ($C_k$) index register in the control module (CM) is assigned by means of the control module (CM) to the capacitor ($C_{n-1}$) having the highest capacitance value in the array (A) of capacitors by writing the value of the index of the capacitor ($C_{n-1}$) to the destination capacitor ($C_k$) index register, and after that the process of electric charge transfer from the source capacitor ($C_i$) to the destination capacitor ($C_k$) is realized by the use of the current source (I) on the basis of the output signals of the comparators (K1) and (K2) until the voltage ($U_i$) on the source capacitor ($C_i$) observed by the use of the first comparator (K1) equals zero during the period in which the function of the destination capacitor ($C_k$) is assigned to the capacitor ($C_O$) having the lowest capacitance value in the array (A) of capacitors, or the voltage ($U_O$), which increases on the capacitor ($C_O$) and is simultaneously observed by the use of the second comparator (K2), equals the reference voltage ($U_L$) value.

3. The method for conversion as claimed in claim 1 characterized in that electric charge is accumulated during the active state of the gate signal detected by means of the control module (CM) in the capacitor ($C_{n-1}$) having the highest capacitance value in the array (A) of capacitors and at the same time in the sampling capacitor ($C_n$) connected in parallel to the capacitor ($C_{n-1}$) in the array (A) of capacitors where the capacitance value of the sampling capacitor ($C_n$) is not smaller than the capacitance value of the capacitor ($C_{n-1}$), and after detecting the end of the active state of the gate signal by means of the control module (CM), the function of the source capacitor ($C_i$) whose index is defined by the content of the source capacitor ($C_i$) index register in the control module (CM) is assigned by means of the control module (CM) to the sampling capacitor ($C_n$) by writing the value of the index of the sampling capacitor ($C_n$) to the source capacitor ($C_i$) index register, and also the function of the destination capacitor ($C_k$) whose index is defined by the content of the destination capacitor ($C_k$) index register in the control module (CM) is assigned by means of the control module (CM) to the capacitor ($C_{n-1}$) in the array (A) of capacitors by writing the value of the index of the capacitor ($C_{n-1}$) in the array (A) of capacitors to the destination capacitor ($C_k$) index register, and after that the process of the electric charge transfer from the source capacitor ($C_i$) to the destination capacitor ($C_k$) is realized by the use of the current source (I) on the basis of the output signals of the comparators (K1) and (K2) until the voltage ($U_i$) on the source capacitor ($C_i$) observed by the use of the first comparator (K1) equals zero during the period in which the function of the destination capacitor ($C_k$) is assigned to the capacitor ($C_O$) having the lowest capacitance value in the array (A) of capacitors, or the voltage ($U_O$), which increases on the capacitor ($C_O$) and is simultaneously observed by the use of the second comparator (K2), equals the reference voltage ($U_L$) value.

4. An apparatus for conversion of a portion of electric charge to a digital signal comprising an array of capacitors and at least one comparator connected to a control module equipped with a digital output where control outputs of the control module are connected to an array of capacitors characterized in that a charge input (InQ) is connected to the array (A) of capacitors whose control inputs are connected to a set of control outputs (E) of the control module (CM), and also the control module (CM) is equipped with a digital output (B), a complete conversion signal output (OutR), a gate signal input (InG) and two control inputs (In1) and (In2) where a first control input (In1) is connected to an output of a first comparator (K1) whose inputs are connected to one pair of outputs of the array (A) of capacitors, and the other control input (In2) of the control module (CM) is connected to an output of a second comparator (K2) whose inputs are connected to the other pair of outputs of the array (A), and furthermore, a source of auxiliary voltage ($U_H$) together with a source of the reference voltage ($U_L$) and a controlled current source (I) are connected to the array (A) of capacitors, and the control input of the controlled current source (I) is connected to a control output ($A_I$) of the control module (CM).

5. The apparatus as claimed in claim 4 characterized in that the array (A) of capacitors comprises a number of n capacitors ($C_{n-1}, C_{n-2}, \ldots, C_1, C_0$), and a capacitance value of a capacitor of a given index is twice as high as a capacitance value of a capacitor of a previous index, and the top plate of a capacitor ($C_{n-1}$) having the highest capacitance value in the array (A) of capacitors is connected through a closed first on-off switch ($S_{Ln-1}$) to a first rail (L) with which the top plates of the other capacitors ($C_{n-2}, \ldots, C_1, C_0$) in the array (A) of capacitors are connected through open first on-off switches ($S_{Ln-2}, \ldots, S_{L1}, S_{L0}$), while the top plate of the capacitor ($C_{n-1}$) is also connected through a closed second on-off switch ($S_{Hn-1}$) to a second rail (H) with which the top plates of the other capacitors ($C_{n-2}, \ldots, C_1, C_0$) in the array (A) are connected through open second on-off switches ($S_{Hn-2}, \ldots, S_{H1}, S_{H0}$), and the bottom plate of the capacitor ($C_{n-1}$) is connected to a ground of the circuit through a change-over switch ($S_{Gn-1}$) whose moving contact is connected to its first stationary contact and the other stationary contact of the change-over switch ($S_{Gn-1}$) is connected to a source of auxiliary voltage ($U_H$) and also to a non-inverting input of a first comparator (K1), while the bottom plates of the other capacitors ($C_{n-2}, \ldots, C_1, C_0$) in the array (A) are connected to e a source of auxiliary voltage ($U_H$) through the change-over switches ($S_{Gn-2}, \ldots, S_{G1}, S_{G0}$) whose moving contacts are connected to their other stationary contacts, and the first stationary contacts of the change-over switches ($S_{Gn-2}, \ldots, S_{G1}, S_{G0}$) are connected to the ground of the circuit, whereas the first rail (L) is connected to the ground of the circuit through an open first rail on-off switch ($S_{Gall}$) and to the non-inverting input of the second comparator (K2) whose inverting input is connected to a source of a reference voltage ($U_L$), while the second rail (H) is connected to an inverting input of the first comparator (K1), and moreover, the control inputs of the first on-off switches ($S_{Ln-1}, S_{Ln-2}, \ldots, S_{L1}, S_{L0}$) and the control inputs of the change-over switches ($S_{Gn-1}, S_{Gn-2}, \ldots, S_{G1}, S_{G0}$) in the array (A) are coupled together and connected to relevant control outputs ($I_{n-1}, I_{n-2}, \ldots, I_1, I_0$) of a set of control outputs (E) of the control module (CM), while the control inputs of the second on-off switches ($S_{Hn-1}, S_{Hn-2}, \ldots, S_{H1}, S_{H0}$) and the control input of the first rail on-off switch ($S_{Gall}$) are connected to relevant control outputs ($D_{n-1}, D_{n-2}, \ldots, D_1, D_0$) and ($D_{all}$) of the set of control outputs (E) of the control module (CM), while a charge input (InQ) is connected to the first rail (L) through a closed input on-off switch ($S_Q$) whose control input is connected to a control output ($A_Q$) of the control module (CM), whereas one end of the current source (I) is connected to the second rail (H), and its other end of the current source (I) is connected to the first rail (L), and the control input of the current source (I) is connected to a control output ($A_I$) of the control module (CM).

6. The apparatus as claimed in claim 5 characterized in that a sampling capacitor ($C_n$) is connected to the array (A) of capacitors, while the top plate of the sampling capacitor ($C_n$) is connected to the first rail (L) through a closed first on-off switch ($S_{Ln}$) and also it is connected to the second rail (H) through an open second on-off switch ($S_{Hn}$), whereas a bottom plate of the sampling capacitor ($C_n$) is connected to the ground of the circuit through a change-over switch ($S_{Gn}$) whose moving contact is connected to its first stationary contact, and the other stationary contact of the change-over switch ($S_{Gn}$) is connected to the source of auxiliary voltage ($U_H$), and a control input of the first on-off switch ($S_{Ln}$) and a control input of the change-over switch ($S_{Gn}$) are coupled together and connected to a control output ($I_n$) of the control module (CM), whereas a control input of the second on-off switch ($S_{Hn}$) is connected to a control output ($D_n$) of the control module (CM), and also the top plate of the capacitor ($C_{n-1}$) having the highest capacitance value in the array (A) of capacitors is connected to the first rail (L) through the open first on-off switch ($S_{Ln-1}$) and to the second rail (H) through the closed second on-off switch ($S_{Hn-1}$), while the bottom plate of the capacitor ($C_{n-1}$) is connected to the source of auxiliary voltage ($U_H$) through the change-over switch ($S_{Gn-1}$) whose moving contact is connected to its other stationary contact, whereas the first stationary contact of the change-over switch ($S_{Gn-1}$) is connected to the ground of the circuit.

7. The apparatus as claimed in claim 5 characterized in that the sampling capacitor ($C_n$) is connected to the array (A) of capacitors where the capacitance value of the sampling capacitor ($C_n$) is not smaller than the capacitance value of the capacitor ($C_{n-1}$) having the highest capacitance value in the array (A) of capacitors, while the sampling capacitor ($C_n$) is connected in parallel to the capacitor ($C_{n-1}$) in the array (A) of capacitors through the first rail (L) and through the ground of the circuit in a way that the top plate of the sampling capacitor ($C_n$) is connected to the first rail (L) through the closed first on-off switch ($S_{Ln}$), and on the other hand the bottom plate of the sampling capacitor ($C_n$) is connected to the ground of the circuit through the change-over switch ($S_{Gn}$) whose moving contact is connected to its first stationary contact, and the other stationary contact of the change-over switch ($S_{Gn}$) is connected to the source of auxiliary voltage ($U_H$), and moreover, the top plate of the sampling capacitor ($C_n$) is connected also to the second rail (H) through the open second on-off switch ($S_{Hn}$), whereas the control input of the first on-off switch ($S_{Ln}$) and the control input of the change-over switch ($S_{Gn}$) are coupled together and connected to the control output ($I_n$) of the control module (CM), and the control input of the second on-off switch ($S_{Hn}$) is connected to the control output ($D_n$) of the control module (CM).

* * * * *